(12) United States Patent
Kondo

(10) Patent No.: US 8,780,950 B2
(45) Date of Patent: Jul. 15, 2014

(54) SURFACE EMITTING SEMICONDUCTOR LASER, SURFACE EMITTING SEMICONDUCTOR LASER DEVICE, LIGHT TRANSMISSION APPARATUS, AND INFORMATION PROCESSING APPARATUS

(75) Inventor: Takashi Kondo, Kanagawa (JP)

(73) Assignee: Fuji Xerox Co., Ltd., Tokyo (JP)

( * ) Notice: Subject to any disclaimer, the term of this patent is extended or adjusted under 35 U.S.C. 154(b) by 85 days.

(21) Appl. No.: 13/596,698

(22) Filed: Aug. 28, 2012

(65) Prior Publication Data

US 2013/0243023 A1 Sep. 19, 2013

(30) Foreign Application Priority Data

Mar. 15, 2012 (JP) ................................. 2012-058104

(51) Int. Cl.
*H01S 5/00* (2006.01)

(52) U.S. Cl.
USPC .................. 372/50.124; 372/44.01; 372/45.01

(58) Field of Classification Search
CPC ... H01S 5/0421; H01S 5/0424; H01S 5/1039; H01S 5/12; H01S 5/125; H01S 5/18; H01S 5/1827; H01S 5/18344; H01S 5/323
USPC ..................... 372/44.01, 45.01, 50.11, 50.124
See application file for complete search history.

(56) References Cited

U.S. PATENT DOCUMENTS

| 4,630,083 | A | * | 12/1986 | Yamakoshi | 257/13 |
| 5,557,627 | A | * | 9/1996 | Schneider et al. | 372/50.12 |
| 5,811,839 | A | * | 9/1998 | Shimoyama et al. | 257/94 |
| 2005/0089074 | A1 | | 4/2005 | Koelle et al. | |
| 2009/0135872 | A1 | | 5/2009 | Uchida et al. | |
| 2009/0135876 | A1 | | 5/2009 | Takeuchi et al. | |
| 2010/0271690 | A1 | * | 10/2010 | Kawakita et al. | 359/344 |
| 2013/0083304 | A1 | * | 4/2013 | Kondo et al. | 355/55 |

FOREIGN PATENT DOCUMENTS

| JP | A-2005-108983 | 4/2005 |
| JP | A-2005-129960 | 5/2005 |
| JP | A-2009-147302 | 7/2009 |
| JP | A-2009-152553 | 7/2009 |

OTHER PUBLICATIONS

Mahmoud et al., "Analysis of longitudinal mode wave guiding in vertical-cavity surface-emitting lasers with long monolithic cavity," Applied Physics Letters, vol. 78, No. 5, pp. 586-588.
Unold et al., "Improving Single-Mode VCSEL Performance by Introducing a Long Monolithic Cavity," IEEE Photonics Technology Letters, vol. 12, No. 8, pp. 939-941, Aug. 2000.

* cited by examiner

*Primary Examiner* — Armando Rodriguez
(74) *Attorney, Agent, or Firm* — Oliff PLC

(57) ABSTRACT

A surface emitting semiconductor laser includes a substrate, a first semiconductor multi-layer reflector formed on the substrate and including a pair of a high refractive index layer having a relatively high refractive index and a low refractive index layer having a relatively low refractive index which are laminated, a semi-insulating i type AlGaAs layer formed on the first semiconductor multi-layer reflector, an n type semiconductor layer formed on the AlGaAs layer, an active region formed on the semiconductor layer, a p type second semiconductor multi-layer reflector formed on the active region and including a pair of a high refractive index layer having a relatively high refractive index and a low refractive index layer having a relatively low refractive index which are laminated, an n side first electrode electrically connected to the semiconductor layer, and a p side second electrode electrically connected to the second semiconductor multi-layer reflector.

18 Claims, 7 Drawing Sheets

10 VCSEL

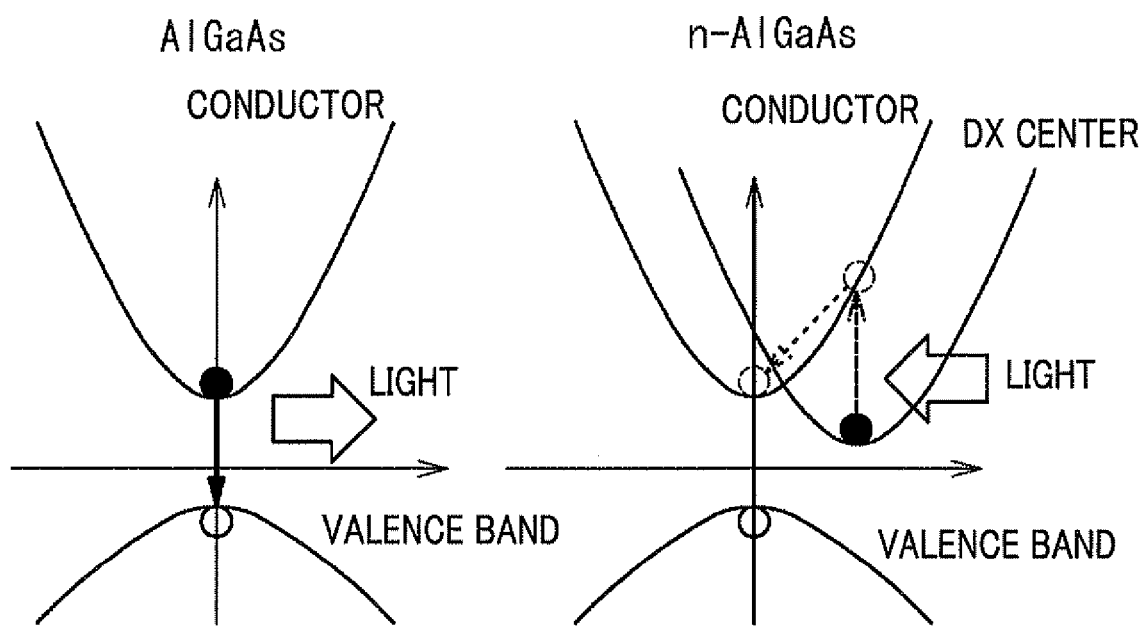

SURFACE EMITTING SEMICONDUCTOR LASER, SURFACE EMITTING SEMICONDUCTOR LASER DEVICE, LIGHT TRANSMISSION APPARATUS, AND INFORMATION PROCESSING APPARATUS

CROSS-REFERENCE TO RELATED APPLICATIONS

This application is based on and claims priority under 35 USC 119 from Japanese Patent Application No. 2012-058104 filed Mar. 15, 2012.

BACKGROUND

Technical Field

The present invention relates to a surface emitting semiconductor laser, a surface emitting semiconductor laser device, a light transmission apparatus, and an information processing apparatus.

SUMMARY

According to an aspect of the invention, there is provided a surface emitting semiconductor laser including a substrate; a first semiconductor multi-layer reflector formed on the substrate and including a pair of a high refractive index layer having a relatively high refractive index and a low refractive index layer having a relatively low refractive index which are laminated; a semi-insulating i type AlGaAs layer formed on the first semiconductor multi-layer reflector and having an optical film thickness larger than an oscillation wavelength; an n type semiconductor layer formed on the AlGaAs layer, not having a deep level due to an impurity, or the deep level being higher than a $\Gamma$ level, and capable of having a lattice matching with the substrate; an active region formed on the semiconductor layer; a p type second semiconductor multi-layer reflector formed on the active region and including a pair of a high refractive index layer having a relatively high refractive index and a low refractive index layer having a relatively low refractive index which are laminated; an n side first electrode electrically connected to the semiconductor layer; and a p side second electrode electrically connected to the second semiconductor multi-layer reflector.

BRIEF DESCRIPTION OF THE DRAWINGS

Exemplary embodiments of the present invention will be described in detail based on the following figures, wherein:

FIG. 2A is a diagram illustrating an energy band of AlGaAs;

FIG. 2B is a diagram illustrating an energy band for describing the DX center of an n type AlGaAs;

DETAILED DESCRIPTION

Next, exemplary embodiments of the invention will be described with reference to the drawings. A surface emitting semiconductor laser (also referred to as VCSEL (Vertical Cavity Surface Emitting Laser)) is used for a light source of a communication apparatus or an image forming apparatus. In the surface emitting semiconductor laser used for such a light source, there are demands for lengthening life of the element by improving light output or resistance to ESD (Electro Static Discharge) whereas by reducing a resistance value or heat emission.

In a selectively oxidized type surface emitting semiconductor laser, a single transverse mode is obtained by decreasing the oxidization aperture diameter of a current confining layer up to about 3 microns, but if the oxidization aperture diameter is decreased, resistance of the element is increased, in turn, heat emission temperature is also increased, and thereby life thereof is shortened. In addition, if the oxidization aperture diameter is decreased, the light output is also decreased. As a method for achieving high light output and long life of the surface emitting semiconductor laser, increasing the resonator length is under consideration. The surface emitting semiconductor laser with long resonator typically has a cavity where the resonator length is increased by approximately 3 to 4 microns (ten times to twenty times the oscillation wavelength). If the resonator length is increased, a difference in optical loss between the fundamental transverse mode of a small divergence angle and the high-order transverse mode is increased, and, as a result, the single transverse mode may be obtained even if the oxidization aperture diameter is increased. For the surface emitting semiconductor laser with long resonator, it is possible to increase the oxidization aperture diameter up to approximately 8 microns, and also to increase the light output up to, for example, approximately 5 mW.

Hereinafter, a selectively oxidized surface emitting semiconductor laser with long resonator will be described as an example, and is referred to as a VCSEL. In addition, the scale of the drawings is emphasized for better understanding of the features of the invention, and thus it is noted that it is not necessarily equal to the scale of an actual device.

Embodiments

Figure 1:
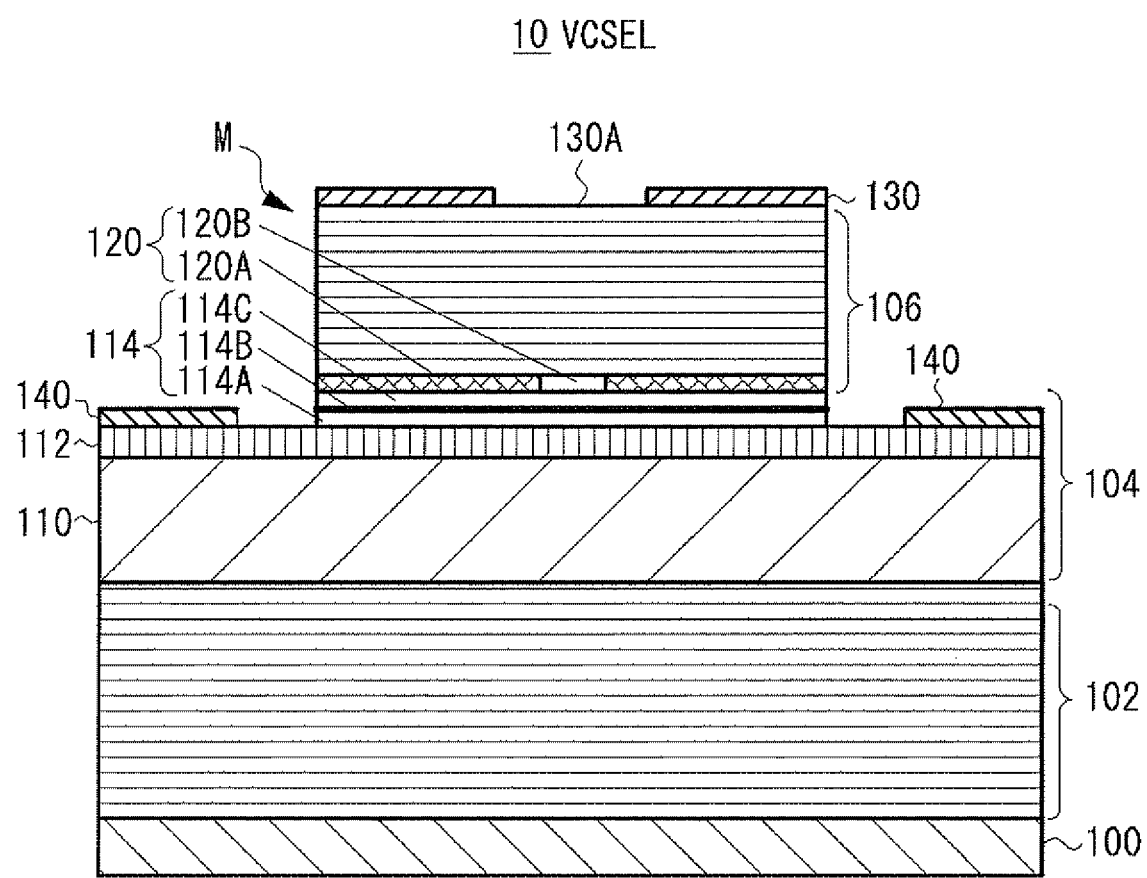
FIG. 1 is a schematic cross-sectional view of a surface emitting semiconductor laser with long resonator structure according to a first exemplary embodiment of the invention.

FIG. 1 is a schematic cross-sectional view of the VCSEL with long resonator according to a first exemplary embodiment of the invention. As shown in the same figure, in the VCSEL 10 with long resonator of the exemplary embodiment, an undoped type (intrinsic) lower distributed Bragg reflector (hereinafter, referred to as "DBR") 102 where AlGaAs layers having different Al compositions alternately overlap each other, a resonator 104 which provides a long resonator structure and is formed on the lower DBR 102, and a p type upper DBR 106 where AlGaAs layers having different Al compositions alternately overlap each other and formed on the resonator 104, are laminated on a semi-insulating i type GaAs substrate 100 undoped with impurities. These semiconductor layers may be formed using MOCVD.

The i type lower DBR 102 is formed by laminating plural pairs of, for example, $Al_{0.9}Ga_{0.1}As$ layer and $Al_{0.3}Ga_{0.7}As$ layer, the thickness of each layer is $\lambda/4n_r$ (where $\lambda$ is an oscillation wavelength, and $n_r$ is a refractive index of a medium), and they are alternately laminated at a 40-period. In addition, the p type upper DBR 106 is formed by laminating plural pairs of p type $Al_{0.9}Ga_{0.1}As$ layer and $Al_{0.3}Ga_{0.7}As$ layer, the thickness of each layer is $\lambda/4n_r$, and they are alternately laminated at a 29-period. The carrier concentration after carbon which is a p type impurity is doped is, for example, $3\times10^{18}$ $cm^{-3}$. A contact layer made of p type GaAs may be formed at the uppermost layer of the upper DBR 106, and a current confining layer 120 made of p type AlAs or AlGaAs is formed at the lowermost layer of or inside the upper DBR 106.

The resonator 104 includes an i type AlGaAs 110 undoped with an impurity, formed on the lower DBR 102, a contact layer 112 formed of an n type semiconductor layer, formed on the AlGaAs 110, and an active region 114 formed on the contact layer 112. The active region 114 includes upper and lower spacer layers 114A and 114C, and a quantum well active layer 114B interposed therebetween, and the film thickness of the active region 114 may be the same as the oscillation wavelength $\lambda$. The lower spacer layer 114A is, for example, an undoped $Al_{0.6}Ga_{0.4}As$ layer, the quantum well active layer 114B is an undoped $Al_{0.11}Ga_{0.89}As$ quantum well layer and an undoped $Al_{0.3}Ga_{0.7}As$ barrier layer, and the upper spacer layer 114C is an undoped $Al_{0.6}Ga_{0.4}As$ layer.

The AlGaAs 110 is a monolithic AlGaAs semiconductor layer formed through a series of epitaxial growths, and the optical film thickness thereof may be any value, for example, several $\lambda$ to several tens of $\lambda$ (where $\lambda$ is an oscillation wavelength). Since the AlGaAs 110 is an i type semiconductor layer undoped with an impurity, a deep impurity level as in the DX center in an n type AlGaAs doped with an impurity such as Si is not formed. In addition, absorption of light by an impurity dopant is suppressed.

The contact layer 112 is made of a material having a lattice matching with the GaAs substrate 100 through a series of epitaxial growths, and the contact layer 112 may be made of n type GaInP. The GaInP does not form the DX center as in the n type AlGaAs, or the deep level (DX center) due to an impurity is higher than the $\Gamma$ level, and thus few crystalline defects occur as compared with the n type AlGaAs. For this reason, as in the n type AlGaAs, there is no deterioration in the active region 114 caused by crystalline defects due to occurrence of the DX center. In addition, the GaInP has a higher selection ratio to an etchant of GaAs or AlGaAs and thus may function as an etching stopper when a mesa M is formed on the substrate as described later. The contact layer 112 may be formed using materials other than GaInP, for example, using such a material where an impurity level is lower than the level of the DX center of the n type AlGaAs. If such a material is used, the possibility that the DX center occurs is lowered as compared with the n type AlGaAs, and thus it is possible to reduce an influence of the DX center. For example, n type AlGaInP or n type AlGaAsP may be used.

The contact layer 112 provides a current path between an n side electrode 140 and the active region 114, and thus the film thickness thereof is selected in order not to increase current resistance thereof. The film thickness of the contact layer 112 may be made equal to or greater than the oscillation wavelength $\lambda$ and thereby low resistance can be achieved. The AlGaAs layer 110 and the contact layer 112 formed between the lower DBR 102 and the active region 114 constitute a resonator extension region, and the resonator extension region may be referred to as a cavity extension region or a cavity space. Typically, a VCSEL without long resonator is not provided with the resonator extension region 110, an active region 106 is typically formed on the lower DBR 102, and the optical film thickness of the resonator 104 is equal to or smaller than $\lambda$.

A cylindrical mesa (columnar structure) M is formed on the substrate 100 by etching a semiconductor layer from the upper DBR 106 to the contact layer 112. As described above, when the contact layer 112 is made of GaInP, the GaInP has a high etching selection ratio to AlGaAs forming the upper DBR 106, and thus the mesa M can be stopped at the contact layer 112 with high accuracy.

Due to the formation of the mesa M, the contact layer 112 is exposed at the bottom of the mesa M. The GaInP does not include Al, and thus is not easily oxidized even if the surface thereof is exposed. In addition, the current confining layer 120 in the upper DBR 106 is exposed from the side surface of the mesa M and is selectively oxidized in an oxidization process. The current confining layer 120 may be located around the active region 114 and be made of p type AlAs or AlGaAs having a very high Al composition (for example, the Al composition is 98% or more). The current confining layer 120 may replace the AlGaAs layer having a high Al composition of the upper DBR 106. The current confining layer 120 includes an oxidized region 120A which is selectively oxidized from the side surface of the mesa M, and a conductive region (oxidization aperture) 120B surrounded by the oxidized region 120A. A in-surface planar shape of the conductive region 120B parallel to the main surface of the substrate 100 has a circular shape reflecting the appearance of the mesa M, and the center thereof substantially conforms to the optical axis of the mesa M in an axial direction. In the VCSEL 10 with long resonator, in order to obtain a fundamental transverse mode, the diameter of the conductive region 120B can become larger than that of a typical VCSEL, and, for example, the diameter of the conductive region 120B is increased to approximately 7 to 8 microns, thereby achieving high light output.

At the uppermost layer of the mesa M, a ring-shaped p side electrode 130 which is made of metal and includes laminated Au, Ti/Au or the like, is formed, and the p side electrode 130 is ohmic-connected to the contact layer of the upper DBR 106. A circular opening, that is, a light exit 130A from which light is emitted at the p side electrode 130, and the center of the light exit 130A substantially conforms to the optical axis of the mesa M. In addition, on the contact layer 112 exposed at the bottom of the mesa M, a ring-shaped n side electrode 140 which is made of metal and includes laminated Au, Ti/Au or the like, is formed, and the n side electrode 140 is electrically connected to the contact layer 112. The p side electrode 130 and the n side electrode 140 may be formed together through a lift-off process.

When a VCSEL without long resonator is operated in a single transverse mode, the VCSEL has a single resonant wavelength, that is, a single longitudinal mode because the resonator length is short. On the other hand, as in the exemplary embodiment, the VCSEL 10 with long resonator has a long resonator length, and thus plural resonant wavelengths may be generated. The number of the generated resonant wavelengths is proportional to the size of the resonator length. For this reason, in the VCSEL with long resonator, switching (switching of longitudinal mode) of the resonant wavelengths is apt to occur due to variations in operation current, and there are cases where an inflection point (kink) is generated at the IL characteristics which are a relationship between input current and laser output. Since the switching of resonant wavelengths is not desirable with high speed modulation of the VCSEL, a reflection band of reflectance (for example, 99% or more) which can give laser oscillation is narrowed by reducing a refractive index difference of a pair of AlGaAs forming the lower DBR 102 or a pair of AlGaAs forming the upper DBR 106, and, as a result, a desired resonant wavelength is selected from plural resonant wavelengths, thereby suppressing the longitudinal mode switching. The VCSEL 10 of the exemplary embodiment outputs single transverse mode laser light of, for example, 780 nm.

FIG. 2A shows an energy band in a normal state (Γ level) of the n type AlGaAs, and FIG. 2B shows an energy band when the DX center is generated in the n type AlGaAs. As shown in FIG. 2A, electrons of a conductor are combined with holes of a valence band, thereby generating light (photon). On the other hand, a deep level of the DX center lower than the Γ level of FIG. 2A is formed inside the n type AlGaAs where the Al composition is 20% or more, and the electros are apt to be trapped in the DX center. At this time, in the IV group donor, the donor moves, and, in the VI group donor, Ga (Al) moves. In addition, the electrons are accumulated in the DX center and absorb light and thereby are released from the DX center and return to the conductor, but, at this time, in the IV group donor, the donor moves, and, in the VI group donor, Ga (Al) moves. As such, the DX center is a deep level which may be generated on the conductor side, and is estimated as an As defect generated by injecting an impurity which is a donor into AlGaAs or GaAs.

The VCSEL 10 with long resonator of the exemplary embodiment uses the i type AlGaAs 110 having a lattice matching with the GaAs substrate 100 and the contact layer 112 made of n type GaInP as a resonator extension region. The i type AlGaAs 110 is not doped with an impurity, and thus does not generate the DX center as in n type AlGaAs doped with an impurity such as Si (FIG. 2B). In the n type AlGaAs layer, a large number of DX centers are generated due to an influence to an Al composition or doping concentration, in turn, the density of crystalline defects is increased, and thereby the crystalline structure of the active layer 1145 is damaged. Therefore, deterioration therein rapidly progresses, which is a factor of considerably deteriorating characteristics thereof.

In addition, the n type GaInP can be made to have a lattice matching with the GaAs substrate 100, and thus can be formed through a series of epitaxial growths. The n type GaInP does not generate a deep level (DX center) as in the n type AlGaAs, and thus a possibility that crystalline defects occur is very low as compared with the n type AlGaAs. Therefore, damage to the crystalline structure of the active layer 1145 caused by GaInP is suppressed. In addition, the growth of GaInP is more difficult than that of AlGaAs; however, GaInP may function as a contact layer of the n side electrode 140 and thus can be made lower than the film thickness of the i type AlGaAs 110.

As above, since the VCSEL 10 with long resonator of the exemplary embodiment does not include the n type AlGaAs which inherently generates the DX center, crystalline structure damage of the active region 114 or deterioration therein due to crystalline defects caused by the DX center can be suppressed, and thus it is possible to obtain a VCSEL with long resonator of long life and high reliability.

Figure 3A:
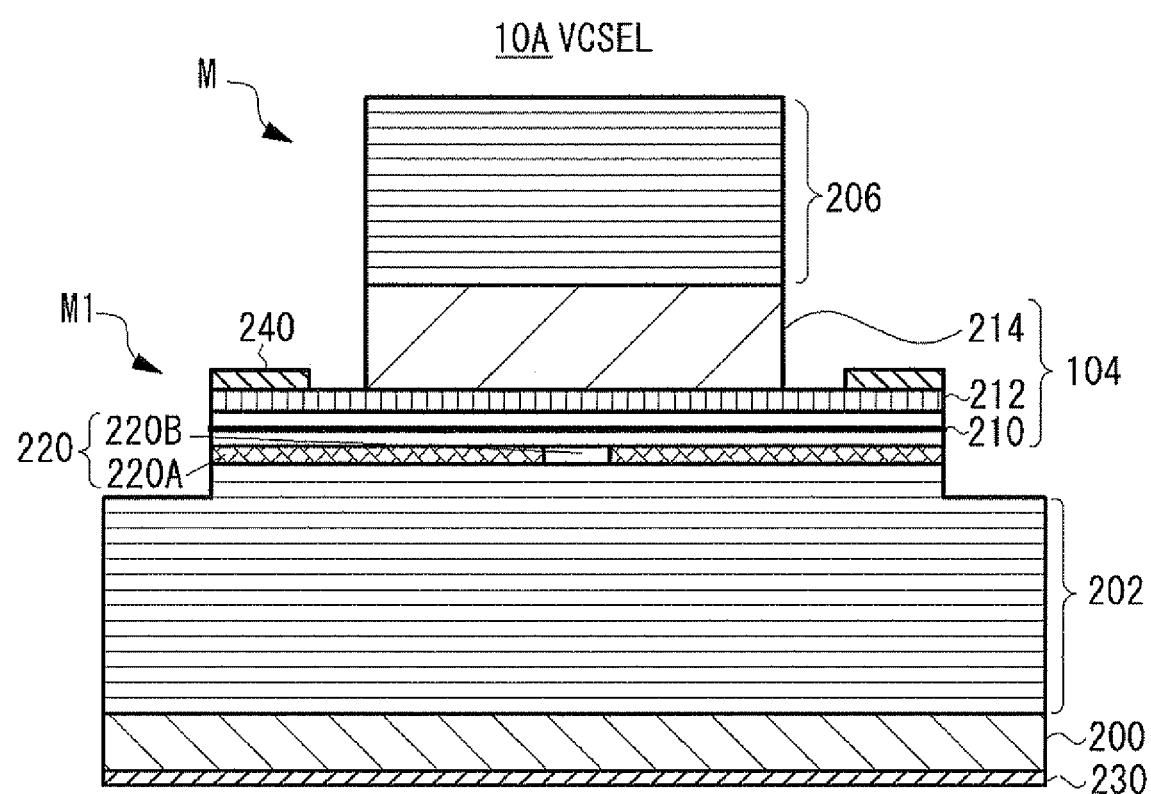
FIGS. 3A and 3B are schematic cross-sectional views of a surface emitting semiconductor laser with long resonator structure according to a second exemplary embodiment of the invention.
Figure 3B:
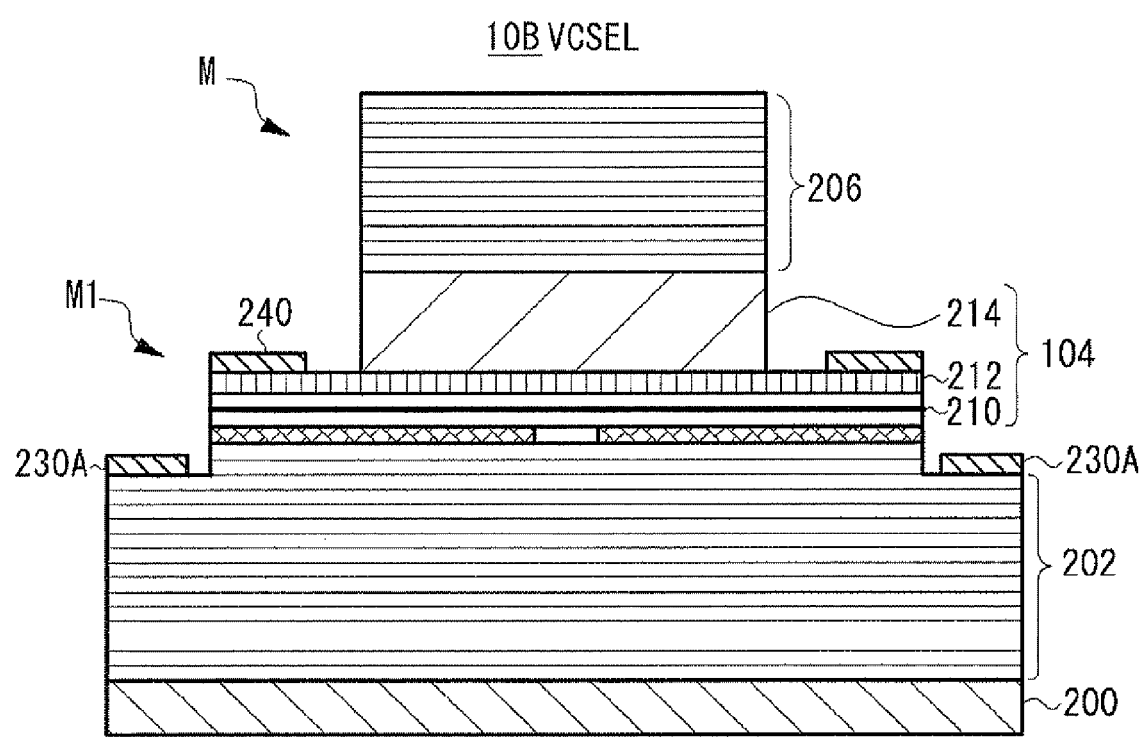

Next, FIGS. 3A and 3B are schematic cross-sectional views of a VCSEL with long resonator according to a second exemplary embodiment of the invention. The VCSEL 10A according to the second exemplary embodiment is formed using a p type GaAs substrate 200. On the GaAs substrate 200, a p type lower DBR 202 where AlGaAs layers having different Al compositions alternately overlap each other, a resonator 204, and a semi-insulating i type upper DBR 206 where AlGaAs layers having different Al compositions alternately overlap each other and are undoped with impurities, are laminated on.

A p side electrode 230 is formed on a rear surface of the substrate 200, and the p side electrode 230 is electrically connected to the lower DBR 202 via the substrate 200. At a portion of the lower DBR 202, a current confining layer 220 is formed so as to be close to an active region, and an oxidized region 220A which is selectively oxidized and a conductive region 220B surrounded thereby are formed. The resonator 204 includes an active region 210 formed on the lower DBR 202, a contact layer 212 which is formed on the active region 210 and is made of n type GaInP, and an i type AlGaAs layer 214 which is formed on the contact layer 212 and is undoped with an impurity. In the same manner as the first exemplary embodiment, the contact layer 212 has the film thickness of the oscillation wavelength λ or more, the i type AlGaAs layer 212 has the film thickness greater than that of the contact layer 212, and a total film thickness of the two may be, for example, 10λ to 20λ.

A mesa M is formed from the upper DBR 206 to the contact layer 212, the contact layer 212 is exposed at the bottom of the mesa M, and a ring-shaped n side electrode 240 is formed on the contact layer 212. Further, a mesa M1 is formed on the lower side of the mesa M so as to expose at least the current confining layer 220, and the current confining layer 220 is selectively oxidized from the side surface of the mesa M1.

In the second exemplary embodiment as well, it is possible to obtain the VCSEL 10A with long resonator which does not include a DX center caused by the n type AlGaAs. As a modified example of the second exemplary embodiment, as shown in FIG. 3B, a p side surface electrode 230A may be formed on the lower DBR 202 exposed by the mesa M1. The p side surface electrode 230A may be used along with a rear surface electrode 230A, or may be used singly as shown in FIG. 3B. When only the p side surface electrode 230A is formed, the substrate 200 may be made of a semi-insulating i type GaAs.

As above, although the exemplary embodiments of the invention have been described in detail, the invention is not limited to a specific exemplary embodiment, and may be variously modified and changed within the scope of the spirit of the invention cited in the claims.

Although, in the above-described exemplary embodiments, the lower DBR 102 and 202 and the upper DBR 106 and 206 are formed using a pair of the high AlGaAs layer having a high Al composition and the low AlGaAs layer having a low Al composition, the lower DBR 102 and 202 and the upper DBR 106 and 206 are not limited to AlGaAs. The lower DBR and the upper DBR may be formed using a high refractive index layer having a relatively high refractive index and a low refractive index layer having a relatively low refractive index, and, for example, a combination of GaAs as the high refractive index layer and AlGaAs as the low refractive index layer may be used. If an oscillation wavelength is long, GaAs may be used for the DBR.

Although, in the exemplary embodiments, the optical film thickness of the resonator extension region 105 is 16λ, this is an example, and, for example, it is selected from a range of 10λ to 20λ. However, if the resonator length is increased, it is noted that the number of resonant wavelengths is increased in proportion thereto. In addition, a refractive index difference (in this example, a difference in the Al composition) between a high refractive index layer and a lower refractive index layer forming the lower DBR or the upper DBR is appropriately selected in terms of a relationship with resonant wavelengths which can exist. That is to say, a refractive index difference is selected so as to obtain a reflection band where the reflectance of undesired resonant wavelengths is reduced. Further, the diameter of the conductive region (oxidization aperture) of the current confining layer 120 and 220 may be appropriately changed depending on a required light output or the like. In addition, although a single spot VCSEL has been exemplified in the exemplary embodiments, a multi-spot VCSEL or VCSEL array where plural mesas (light emitting portions) are formed on the substrate.

Figure 4A:
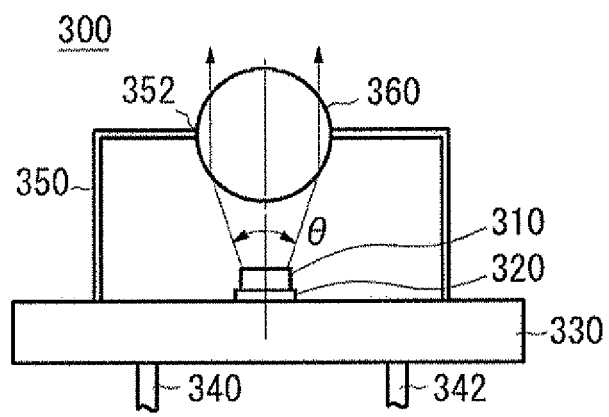
FIGS. 4A and 4B are schematic cross-sectional views illustrating a configuration of a surface emitting semiconductor laser device where the surface emitting semiconductor laser of the exemplary embodiment is mounted with optical members.

Next, a surface emitting semiconductor laser device, an optical information processing apparatus, and a light transmission apparatus using the VCSEL of the exemplary embodiment will be described with reference to the drawings. FIG. 4A is a cross-sectional view of a configuration of the surface emitting semiconductor laser device having the VCSEL and optical members mounted (packaged) therein. In the surface emitting semiconductor laser device 300, a tip 310 in which the long resonator VCSEL is formed is fixed onto a metal stem 330 via a conductive adhesive 320. Conductive leads 340 and 342 are inserted into through-holes (not shown) formed at the stem 330, one lead 340 is electrically connected to an n side electrode of the VCSEL, and the other lead 342 is electrically connected to a p side electrode.

A rectangular hollow cap 350 is fixed onto the stem 330 including the tip 310, and a ball lens 360 which is an optical member is fixed inside an opening 352 located at the center of the cap 350. The optical axis of the ball lens 360 is positioned so as to substantially conform to the center of the tip 310. When a forward voltage is applied between the leads 340 and 342, laser light is emitted from the tip 310 in the vertical direction. The distance between the tip 310 and the ball lens 360 is adjusted such that the ball lens 360 is included in the divergence angle θ of the laser light from the tip 310. In addition, a light receiving element or a temperature sensor for monitoring a light emitting state of the VCSEL may be included in the cap.

Figure 4B:
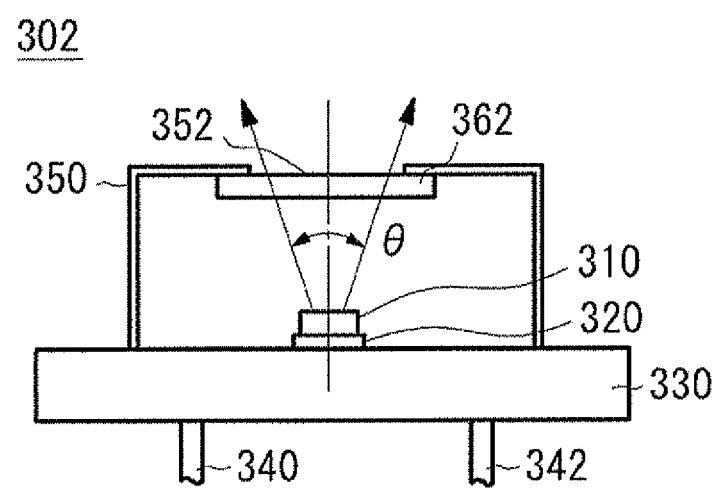

FIG. 4B is a diagram illustrating a configuration of another surface emitting semiconductor laser device, and the surface emitting semiconductor laser device 302 shown in the same figure fixes a flat glass 362 inside the opening 352 located at the center of the cap 350 instead of the ball lens 360. The center of the flat glass 362 is positioned so as to substantially conform to the center of the tip 310. The distance between the tip 310 and the flat glass 362 is adjusted such that the aperture diameter of the flat glass 362 is equal to or more than the divergence angle θ of the laser light from the tip 310.

Figure 5:
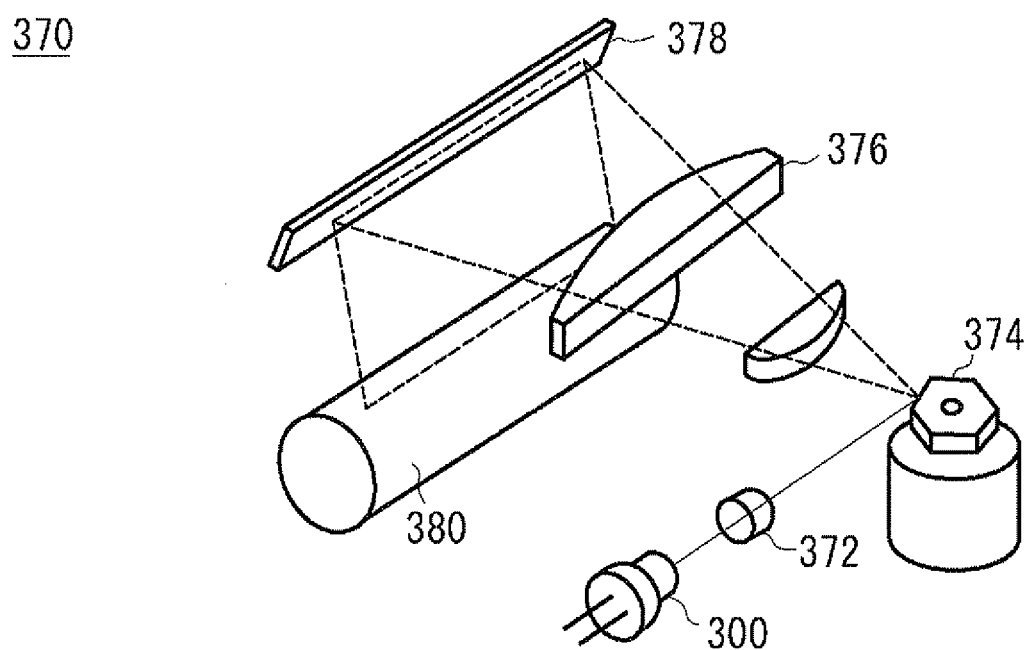
FIG. 5 is a diagram illustrating a configuration example of the light source apparatus using the surface emitting semiconductor laser of the exemplary embodiment.

FIG. 5 is a diagram illustrating an example where the VCSEL is applied to an optical information processing apparatus. The optical information processing apparatus 370 includes a collimate lens 372 to which laser light from the surface emitting semiconductor laser device 300 or 302 having the long resonator VCSEL mounted therein as shown in FIG. 4A or 4B is incident, a polygon mirror 374 which rotates at a constant speed and reflects a bundle of light beams from the collimate lens 372 in a specific divergence angle, a fθ lens 376 to which the laser light from the polygon mirror 374 is incident so as to irradiate a reflection mirror 378, the linear reflection mirror 378, and a photoconductor drum (recording medium) 380 which forms a latent image on the basis of the reflected light from the reflection mirror 378. As such, the VCSEL may be used as a light source of an optical information processing apparatus such as a copier or a printer which includes an optical system for collecting laser light from the VCSEL at the photoconductor drum and a mechanism for scanning the collected laser light on the photoconductor drum.

Figure 6:
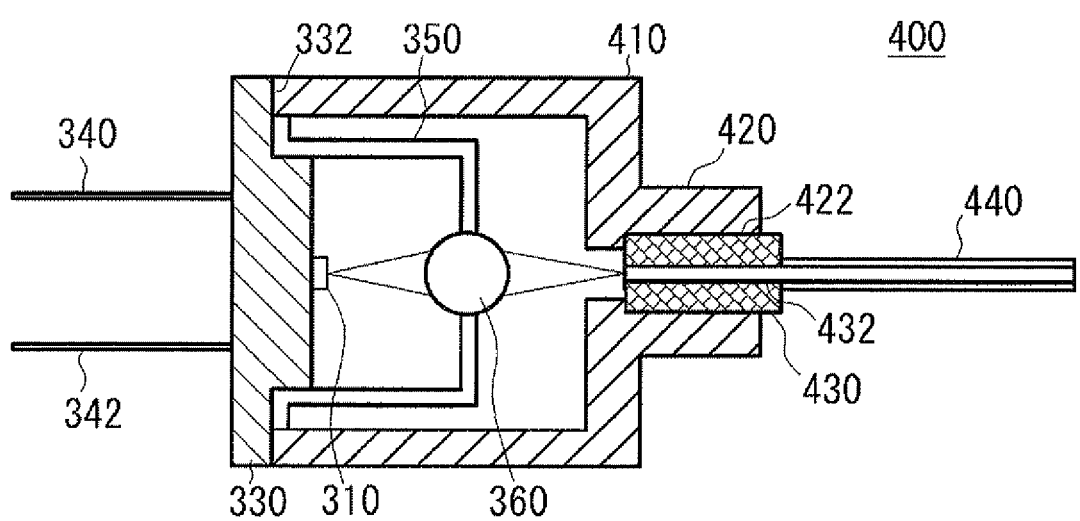
FIG. 6 is a schematic cross-sectional view illustrating a configuration of a light transmission apparatus using the surface emitting semiconductor laser device shown in FIG. 4A.

FIG. 6 is a cross-sectional view illustrating a configuration when the surface emitting semiconductor laser device shown in FIG. 4A is applied to a light transmission apparatus. The light transmission apparatus 400 includes a cylindrical casing 410 fixed to a stem 330, a sleeve 420 integrally formed at an end surface of the casing 410, a ferrule 430 held inside an opening 422 of the sleeve 420, and an optical fiber 440 held by the ferrule 430. The end portion of the casing 410 is fixed to a flange 332 which is formed in a circumferential direction of the stem 330. The ferrule 430 is accurately positioned at the opening 422 of the sleeve 420, and the optical axis of the optical fiber 440 matches with the optical axis of the ball lens 360. A core wire of the optical fiber 440 is held in a through-hole 432 of the ferrule 430.

The laser light emitted from the surface of the tip 310 is collected by the ball lens 360, and the collected light is incident to the core wire of the optical fiber 440 and is transmitted. Although, in the above example, the ball lens 360 is used, other lenses such as a biconvex lens or a plano-convex lens may be used. In addition, the light transmission apparatus 400 may include a driving circuit for applying an electric signal to the leads 340 and 342. Further, the light transmission apparatus 400 may have a reception function of receiving a light signal via the optical fiber 440.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A surface emitting semiconductor laser comprising:
   a substrate;
   a first semiconductor multi-layer reflector formed on the substrate and including a pair of a high refractive index layer having a relatively high refractive index and a low refractive index layer having a relatively low refractive index which are laminated;
   a semi-insulating i type AlGaAs layer formed on the first semiconductor multi-layer reflector and having an optical film thickness larger than an oscillation wavelength;
   an n type semiconductor layer formed on the AlGaAs layer, not having a deep level due to an impurity, or the deep level being higher than a Γ level, and capable of having a lattice matching with the substrate;
   an active region formed on the semiconductor layer;
   a p type second semiconductor multi-layer reflector formed on the active region and including a pair of a high refractive index layer having a relatively high refractive index and a low refractive index layer having a relatively low refractive index which are laminated;
   an n side first electrode electrically connected to the semiconductor layer; and
   a p side second electrode electrically connected to the second semiconductor multi-layer reflector;
   wherein
   a length of a resonator defined by the first semiconductor multi-layer reflector the AlGaAs layer, the semiconductor layer, the active region, and the second semiconductor multi-layer reflector is greater than the oscillation wavelength, at least two resonant wavelengths are included in a reflection band of the resonator, and a selected resonant wavelength is oscillated.

2. The surface emitting semiconductor laser according to claim 1, wherein the semiconductor layer is made of an n type GaInP.

3. The surface emitting semiconductor laser according to claim 1, wherein the first semiconductor multi-layer reflector is of a semi-insulating i type.

4. The surface emitting semiconductor laser according to claim 2, wherein the first semiconductor multi-layer reflector is of a semi-insulating i type.

5. The surface emitting semiconductor laser according to claim 1, wherein a columnar structure from the second semiconductor multi-layer reflector to the semiconductor layer is formed, the second electrode electrically connected to the second semiconductor multi-layer reflector is formed on a top portion of the columnar structure, and the first electrode electrically connected to the second semiconductor multi-layer reflector is formed on the semiconductor layer which is exposed at a bottom portion of the columnar structure.

6. The surface emitting semiconductor laser according to claim 1, wherein a current confining layer is formed inside the second semiconductor multi-layer reflector.

7. The surface emitting semiconductor laser according to claim 1, wherein the first semiconductor multi-layer reflector includes a pair of an AlGaAs layer having a relatively high Al composition and an AlGaAs layer having a relatively low Al composition, and the second semiconductor multi-layer reflector includes a pair of an AlGaAs layer having a relatively high Al composition and an AlGaAs layer having a relatively low Al composition.

8. The surface emitting semiconductor laser according to claim 1, wherein the semiconductor layer is made of n type AlGaInP.

9. The surface emitting semiconductor laser according to claim 1, wherein the semiconductor layer is made of n type AlGaAsP.

10. A surface emitting semiconductor laser comprising:

a p type semiconductor substrate;

a p type first semiconductor multi-layer reflector formed on the semiconductor substrate and including a pair of a high refractive index layer having a relatively high refractive index and a low refractive index layer having a relatively low refractive index which are laminated;

an active region formed on the first semiconductor multi-layer reflector;

an n type semiconductor layer formed on the active region, not having a deep level due to an impurity, or the deep level being higher than a Γ level, and capable of having a lattice matching with the substrate;

a semi-insulating i type AlGaAs layer formed on the semiconductor layer;

a second semiconductor multi-layer reflector formed on the AlGaAs layer and including a pair of a high refractive index layer having a relatively high refractive index and a low refractive index layer having a relatively low refractive index which are laminated;

an n side first electrode electrically connected to the semiconductor layer; and a p side second electrode electrically connected to the first semiconductor multi-layer reflector.

11. The surface emitting semiconductor laser according to claim 10, wherein the semiconductor layer is made of n type GaInP.

12. The surface emitting semiconductor laser according to claim 10, wherein a length of a resonator defined by the first semiconductor multi-layer reflector, the active region, the semiconductor layer, the AlGaAs layer, and the second semiconductor multi-layer reflector is greater than the oscillation wavelength, at least two resonant wavelengths are included in a reflection band of the resonator, and a selected resonant wavelength is oscillated.

13. The surface emitting semiconductor laser according to claim 10, wherein a columnar structure from the second semiconductor multi-layer reflector to the semiconductor layer is formed, the first electrode electrically connected to the second semiconductor multi-layer reflector is formed on the semiconductor layer which is exposed at a bottom portion of the columnar structure, and the second electrode electrically connected to the first semiconductor multi-layer reflector is formed on a rear surface of the semiconductor substrate.

14. The surface emitting semiconductor laser according to claim 10, wherein the semiconductor layer is made of n type AlGaInP.

15. The surface emitting semiconductor laser according to claim 10, wherein the semiconductor layer is made of n type AlGaAsP.

16. A surface emitting semiconductor laser device comprising:

the surface emitting semiconductor laser according to claim 1; and an optical member to which light from the surface emitting semiconductor laser is incident.

17. A light transmission apparatus comprising:

the surface emitting semiconductor laser device according to claim 16; and a transmission unit that transmits laser light emitted from the surface emitting semiconductor laser device via an optical medium.

18. An information processing apparatus comprising:

the surface emitting semiconductor laser according to claim 1;

a condenser that collects laser light emitted from the surface emitting semiconductor laser at a recording medium; and a mechanism that scans the laser light collected by the condenser on the recording medium.

* * * * *